US012325625B2

United States Patent
Nasiri et al.

(10) Patent No.: US 12,325,625 B2
(45) Date of Patent: Jun. 10, 2025

(54) INTEGRATED MEMS ELECTROSTATIC MICRO-SPEAKER DEVICE AND METHOD

(71) Applicant: Vibrant Microsystems Inc., Cupertino, CA (US)

(72) Inventors: Steven Nasiri, Los Altos Hills, CA (US); Sanjay Bhandari, Cupertino, CA (US); Ali Joseph Rastegar, Palo Alto, CA (US)

(73) Assignee: Vibrant Microsystems Inc., Cupertino, CA (US)

( * ) Notice: Subject to any disclaimer, the term of this patent is extended or adjusted under 35 U.S.C. 154(b) by 466 days.

(21) Appl. No.: 17/838,780

(22) Filed: Jun. 13, 2022

(65) Prior Publication Data
US 2024/0092629 A1    Mar. 21, 2024

(51) Int. Cl.
*B81B 3/00* (2006.01)
*B81B 7/02* (2006.01)

(52) U.S. Cl.
CPC ............. *B81B 3/0021* (2013.01); *B81B 7/02* (2013.01); *B81B 2201/0257* (2013.01); *B81B 2203/0118* (2013.01); *B81B 2203/0127* (2013.01); *B81B 2207/012* (2013.01); *H04R 2201/003* (2013.01)

(58) Field of Classification Search
CPC . B81B 3/0021; B81B 7/02; B81B 2201/0257; B81B 2203/0118; B81B 2203/0127; B81B 2207/012; B81B 2203/04; H04R 2201/003; H04R 1/24; H04R 3/06; H04R 7/20; H04R 19/005; H04R 19/02; B81C 1/00238
USPC ........................................................ 257/415
See application file for complete search history.

(56) References Cited

U.S. PATENT DOCUMENTS

| | | | |
|---|---|---|---|
| 2012/0139050 A1* | 6/2012 | Yang ................... | B81C 1/00246 257/E21.409 |
| 2013/0136280 A1* | 5/2013 | Stephanou ............ | G06F 1/1637 29/25.35 |
| 2017/0257690 A1* | 9/2017 | Ozawa ................. | H04R 1/2819 |
| 2018/0002167 A1 | 1/2018 | Frischmuth et al. | |

(Continued)

FOREIGN PATENT DOCUMENTS

KR    1020110023535 A    3/2011

OTHER PUBLICATIONS

International Search Report and Written Opinion for related PCT/US2023/068241, mailed Oct. 4, 2023.

*Primary Examiner* — Mohammad M Hoque
(74) *Attorney, Agent, or Firm* — Richard T. Ogawa; Ogawa P.C.

(57) ABSTRACT

In an example, the present invention provides a micro-speaker device. The device has a movable diaphragm device comprising a thickness of silicon or graphene material which has a first surface and a second surface opposite of the first surface. The device has a housing enclosing the movable diaphragm device, the electrode device and an encapsulation device. The electrode device can be part of a CMOS device with electronics integrated on to the device. The device has a vented enclosure opposite of the movable diaphragm to allow air to move in and out of the one or more vent openings to generate a sound pressure signal. The diaphragm can be electrostatically actuated from one or more surfaces that include the electrode device and the encapsulation device.

22 Claims, 9 Drawing Sheets

Cross sectional view of Micro-speaker with current invention

(56) References Cited

U.S. PATENT DOCUMENTS

2018/0367884 A1    12/2018  Murarka et al.
2020/0374635 A1*  11/2020  Zhou .................... H04R 19/005

* cited by examiner

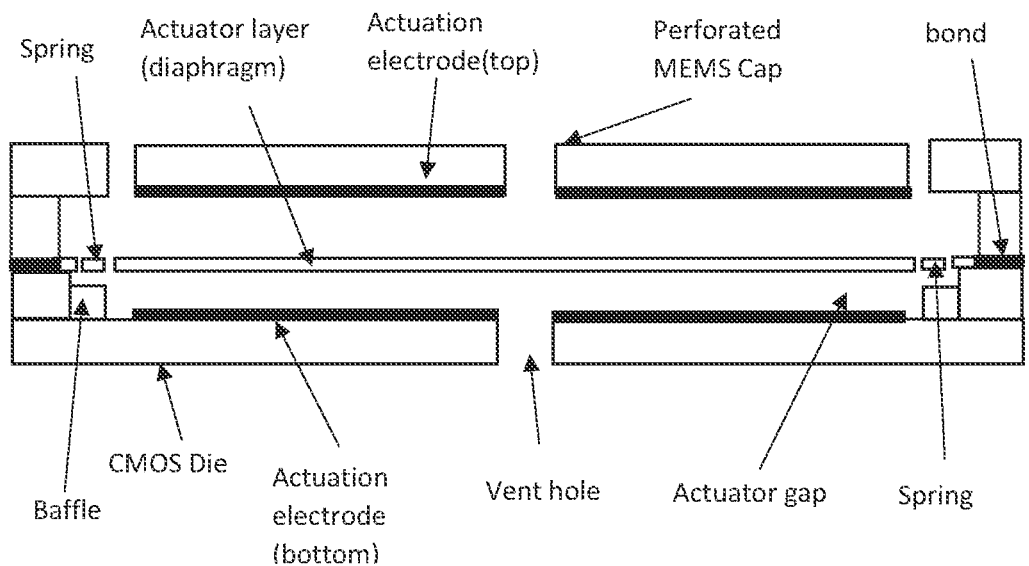
Figure 1 Cross sectional view of Micro-speaker with current invention

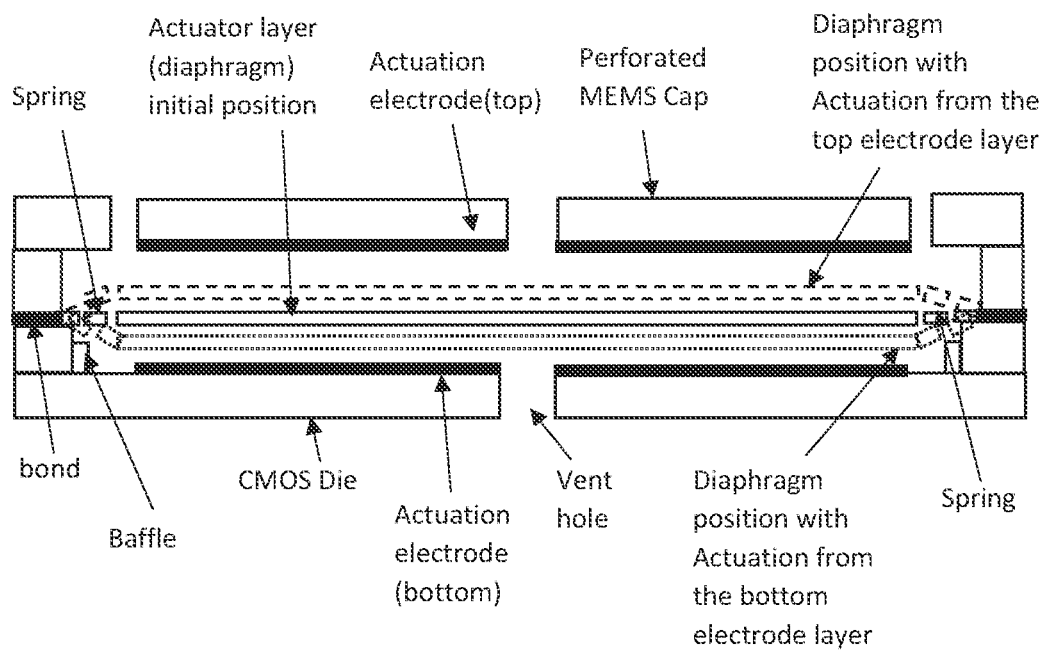
Figure 2 Movement of diaphragm of the Micro-speaker with current invention

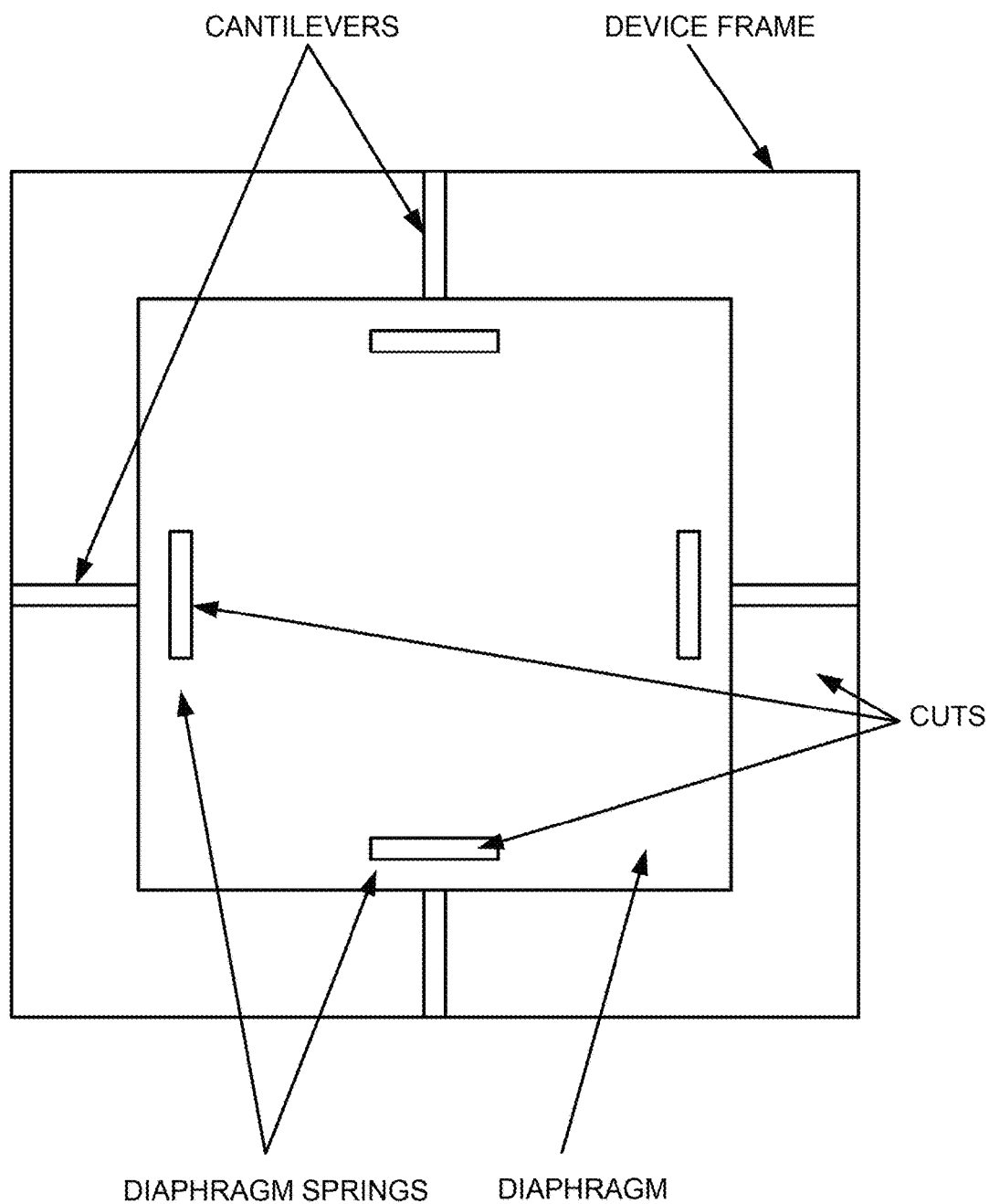
FIGURE 3 EXAMPLE DESIGN OF A DIAPHRAGM OF THE MICRO-SPEAKER WITH CURRENT INVENTION

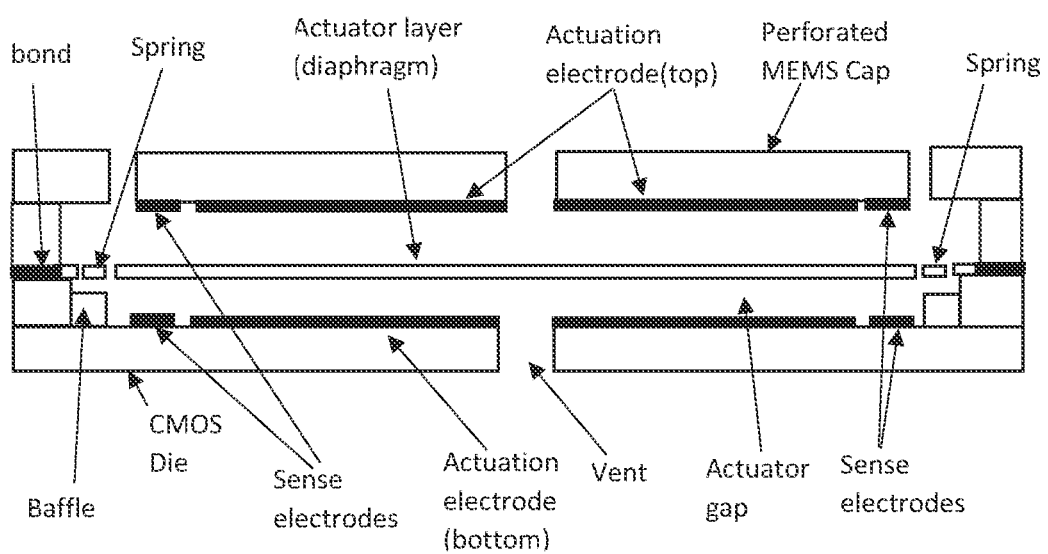
Figure 4 Speaker element vertical stack with sense electrodes

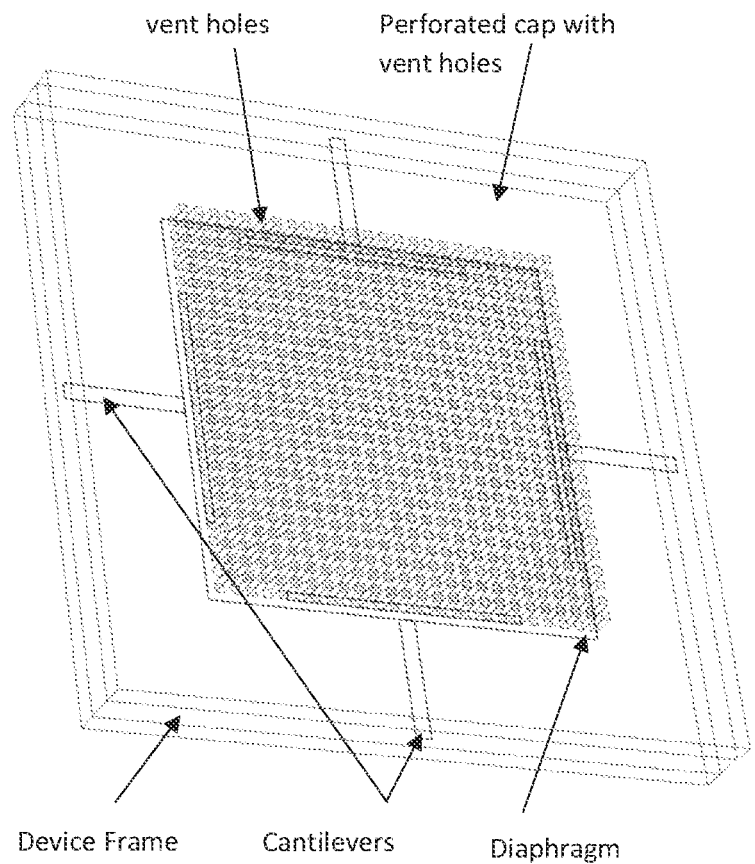
Figure 5. Micro-speaker device with encapsulation & vent holes

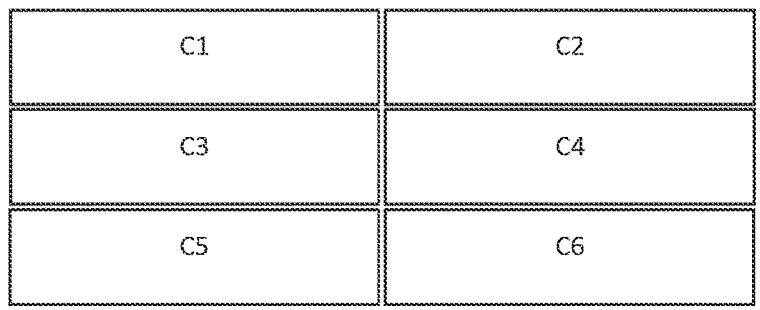
Figure 6 Micro-speaker Array with each speaker cell optimized with different resonance frequency & bandwidth

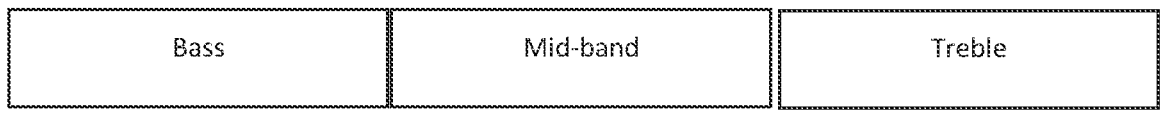
Figure 7 Micro-speaker Array acoustic equalizer

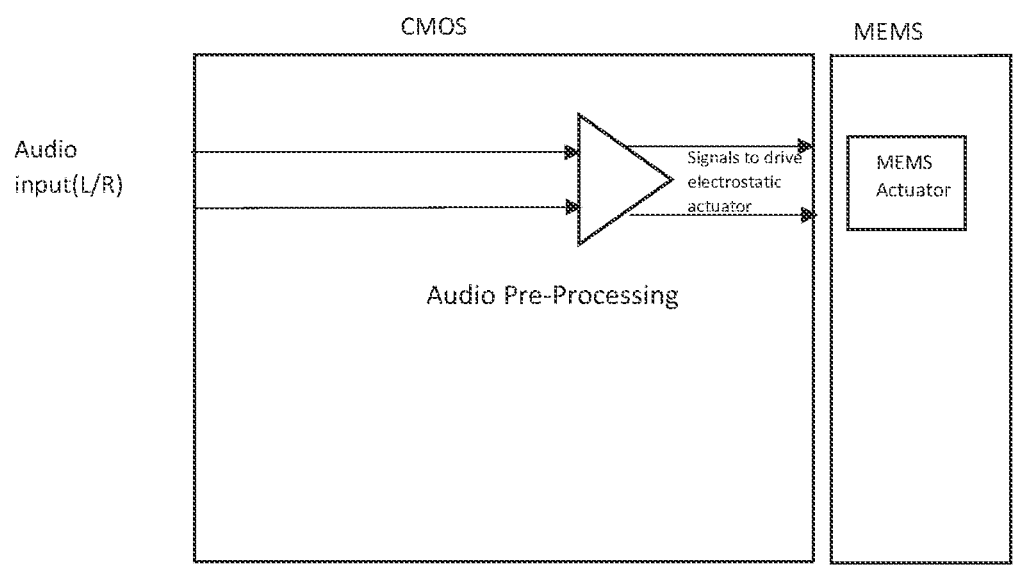
Figure 8 Circuits from CMOS driving the Micro-speaker

INTEGRATED MEMS ELECTROSTATIC MICRO-SPEAKER DEVICE AND METHOD

CROSS-REFERENCE TO RELATED APPLICATIONS

N/A

BACKGROUND OF INVENTION

The present invention is directed to micro electro-mechanical systems, commonly termed "MEMS." In particular, the present invention provides a MEMS speaker device and related methods, including MEMS actuator devices. Although the invention has been described in terms of specific examples, it will be recognized that the invention has a much broader range of applicability.

Loud speakers, also referred to as speaker drivers or speakers, are electro acoustic transducers. A loud speaker is an essential part of many consumer gadgets such as home music systems, MP3 players, smartphones, laptops, tablets, earbuds, among others. As the miniaturization or reduction of height profile of mobile devices advances, speakers have become smaller in size. As an example, terminology, based on the size of the speaker, typically refers speakers with greater than 4-inch diameters as loud speakers, 2-4 inch diameter as mini speakers, and less than 2-inch diameter as micro speakers. More recently with the popularity of ear buds, the size of the speakers has decreased to less than 1-inch diameter.

Most of the conventional speakers, however, are still designed with conventional technologies that are based upon the cone speaker, which is configured with a thin moving diaphragm of paper, plastic, or similar material, driven by a spring element which is actuated by electromagnetic signals that are proportional to an audio signal input to the speaker. The conventional speakers use a permanent magnet to generate a magnetic field in which a moving coil driven by electromagnetic force is operated. The conventional speakers are incompatible with any conventional surface mount printed circuit board (PCB) technology which is a disadvantage in the manufacturing flow for original equipment manufacturers (OEM) of electronic systems. The conventional speaker technology creates additional constraint on the placement in the speaker inside smartphones, as an example, due to the fact that magnets in the speaker adversely affect other components such as sensors and other electronics. These and other limitations plague conventional speakers and related technologies.

From the above, it is seen that conventional speakers have limitations in the consumer devices.

SUMMARY OF INVENTION

The present invention is directed to micro electro-mechanical systems, commonly termed "MEMS." In particular, the present invention provides a MEMS speaker device and related methods, including MEMS actuator devices. Although the invention has been described in terms of specific examples, it will be recognized that the invention has a much broader range of applicability.

In an example, the present invention provides a micro-speaker device. The device has a cap device comprising a plurality of vent regions for propagating acoustic signals. The cap device can be made of a suitable material such as silicon, or other rigid substrate capable of being processed using semiconductor techniques. In an example, the device has a CMOS (i.e., Complementary metal-oxide-semiconductor) device coupled to the cap device. In an example, the CMOS device comprises at least one vent region (although there may be more) configured to allow backpressure to flow therethrough. The CMOS device can be a CMOS semiconductor substrate, including a plurality of CMOS cells. The device has a cavity region configured between a cap interior surface of the cap device and a CMOS device interior surface of the CMOS device. The device has a frame device coupled between the cap device and the CMOS device to form an exterior housing for the cavity region. An example, the frame device can be configured on either or both of the cap device and/or the CMOS device or integral with either or both devices.

In an example, the device has a movable diaphragm device comprising a thickness of silicon or graphene material having a thickness 0.1 nm to ten microns, and configured spatially in an elongated manner within the cavity region. In an example, the movable diaphragm device has a first surface and a second surface opposite of the first surface. In an example, the movable diaphragm is connected with at least two cantilever or springs. Each of the cantilever or springs being coupled between a peripheral region of the movable diagram device and a portion of a frame configured surrounding the movable diaphragm device.

In an example, the device has a CMOS electrode device configured on the CMOS device interior region. That is, the CMOS device has an electrode device or devices formed on an interior region of the CMOS device.

In an example, the device has a cap electrode device configured on the cap interior surface, whereupon each of the cap electrode device and the CMOS electrode device is operable to electrostatically move the movable diaphragm using a pull action to cause movement of the diaphragm in response to the applied electrical signals and cause propagation of acoustic signals from one or more of the plurality of vent regions in the cap device.

Depending upon the example, the present invention can achieve one or more of these benefits and/or advantages. The present invention provides a MEMS Micro-speaker that can reduce the size and profile height of the speaker without affecting the performance. In an example, the present invention can integrate the CMOS audio processing within a monolithic element together with MEMS, thereby miniaturizing the whole audio chain for demanding components such as ear buds, hearables, smartwatches and smart phones. In an example, the present invention can be implemented using conventional semiconductor and MEMS process technologies for wide scale commercialization. These and other benefits and/or advantages are achievable with the present device and related methods. Further details of these benefits and/or advantages can be found throughout the present specification and more particularly below.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 1 is a simplified diagram showing a cross-sectional view of a MEMS micro-speaker designed according to an example of the present invention.

FIG. 2 is a simplified diagram showing the diaphragm actuation with cantilever and springs for the micro-speaker example of the present invention.

FIG. 3 is a simplified diagram of a top view of the diaphragm including cantilever and springs according to an example of the present invention.

FIG. 4 is a simplified diagram showing a cross-sectional view of a MEMS micro-speaker with addition of sense electrodes according to an example of the present invention.

FIG. 5 is a simplified perspective view diagram of a MEMS micro-speaker device with encapsulation and vent holes according to an example of the present invention.

FIG. 6 is a simplified diagram of a speaker array with each speaker cell configured with different resonance frequency and bandwidth according to an example of the present invention.

FIG. 7 is a simplified diagram of a speaker array acoustic equalizer device according to an example of the present invention.

FIG. 8 is a simplified diagram of a circuit from CMOS driving the micro-speaker according to an example of the present invention.

DETAILED DESCRIPTION OF THE EXAMPLES

Figure 9A:
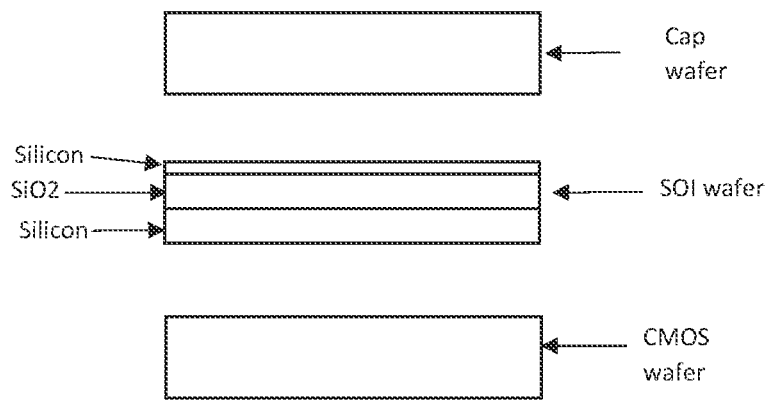
FIGS. 9A, 9B, and 9C are simplified diagrams that illustrate a process for fabricating a micro speaker device according to an example of the present invention.

According to the present invention, techniques directed to micro electro-mechanical systems, commonly termed "MEMS" are provided. In particular, the present invention provides a MEMS speaker device and related methods, including MEMS actuator devices. Although the invention has been described in terms of specific examples, it will be recognized that the invention has a much broader range of applicability.

FIG. 1 is a simplified diagram showing a cross-sectional view of a MEMS micro-speaker device according to an example of the present invention. In an example, the device has an electrode layer including one or more electrodes (as shown, and the term "layer" does not mean a single layer but is to be interpreted as including the substrate or substrate layer as shown, including the electrode devices, among other features) forms a bottom structure of the micro-speaker device. The substrate layer may include a CMOS die (which is made using semiconductor processing techniques) that includes some or all of the electronics for operating the MEMS micro-speaker, including processing of a plurality of audio signal, actuation of an actuator device for the MEMS, sensing of the MEMS movement, including diaphragm device, electronic damping, feedback, and other electronic circuits.

As shown, the electrode layer may have a vent hole (or a plurality of vent regions) to allow air movement there through created by the movement of the diaphragm coupled to the actuator device. The vent hole or holes also leads to a larger back volume for the backside of the diaphragm (where the front side is opposite of the backside, although the term front side and back side are intended to be used in reference to each other and may have other terms).

In an example, the electrode layer may be a CMOS die which will have one or more metal layers. Part of the top metal layer will be used as electrostatic actuator to implement one or more electrodes. In an example, the electrodes are connected to and with drive electronics to supply voltage to the electrodes. In an example, the metal actuator can be symmetrically placed or configured using other spatial configurations. The metal actuator will be driven by an electrical signal that may have DC as well as AC component from the drive electronics. Voltage of the actuator generates an electrostatic force on the MEMS layer above an actuation area, which includes the actuator device. The spacing between the electrode and diaphragm can be defined as an actuator gap, which is generally a free space region.

The 'Actuator Layer', also referred as the MEMS layer or a diaphragm layer (each of which the term layer does not mean a single layer, but can include multiple layers and related structures) is shown as multiple elements in FIG. 1.

The MEMS layer includes a diaphragm designed to have an up and down motion (towards and away from the CMOS actuator metal). The diaphragm is connected to the frame or anchor by using MEMS springs or beams or cantilevers, or any combination of them. The springs may have cantilever action and or torsional force or a combination of the both forces. The MEMS region directly above the metal actuator electrode will move vertically due to an electrostatic force. This force can attract the MEMS actuator and in particular the diaphragm, pulling it closer to the metal surface. The spring also helps in restoring the diaphragm to its original position where there is minimal tension in the spring. As shown, a gap is defined between the moving MEMS element in the actuation area and the metal actuation layer. A smaller gap would exert more electrostatic force than a larger gap. The actuator gap is designed based on the desired movement of the MEMS, the desired electrostatic force, and damping forces.

In an example, the MEMS diaphragm in the speaker area may also be connected with certain voltage. The voltage is designed such that the electrostatic forces are maximized or controlled at a desired level. In an example, the diaphragm is a suitable thickness of silicon material that is actuated and causes movement of air generating audio signals. The thickness is suitable to allow for deflection and actuating at a certain velocity and acceleration.

With an electrostatic force applied from the metal plate or electrode on the CMOS die, the MEMS actuator region in the actuation area will be electrostatically attracted toward the metal plate, thereby pulling it down if the force is attractive. When the electrostatic force from the metal actuator ceases to exist, the diaphragm will move up.

In this example, the cap wafer (shown on top) or its inner surface layer such as metal, may also be driven by a voltage proportional to the audio voltage driving the speaker. If the spacing of the actuator layer from the cap and the CMOS actuation regions are designed to be the same then the force on the actuator layer can become proportional to the applied voltage. Applying electrostatic actuation from both the cap side and the CMOS side helps in increasing the total force and allows motion of the actuator in both directions. In an example of the invention, the cap wafer can be a silicon on insulator ("SOI") substrate where the outer surface is not connected to any potential (or signal) but the SOI silicon is driven by a signal. In another example, the cap wafer will have metal actuation electrode which will be driven by a voltage to attract the diaphragm. The cap wafer will create electrostatic force similar to the actuation layer on the CMOS but opposite in phase.

The vertical up and down movement of the diaphragm is proportional to the audio signal applied to the MEMS speaker cell. The up and down motion pushes air through the perforated MEMS cap thereby creating sound waves to propagate.

In an example, the diaphragm can be made of a suitable material such as a silicon, graphene or a combination of different material. Vertical motion of the diaphragm pushes air up through the perforated MEMS cap. The motion of the diaphragm and the air pressure that transmits to the outer environment is proportional to the audio input, thereby acting as a speaker that is actuated by the electrode coupled to the actuator layer.

In an example, the device has baffle(s) configured within an interior edge portion within the actuator gap. The baffles prevent back air pressure from mixing with the front air waves and causing noise or interference.

The top of the cap may have additional protective material such as a barrier to the electrical conductivity, humidity, moisture or dust particles but allow audio waves to pass through.

In an example, the spring constant, dimensions of the beam connecting to the actuator layer acting as a piston and the area and mass of the diaphragm can be designed to obtain the resonance of the MEMS at a desired frequency. At the resonant frequency, the movement of the diaphragm will be maximum or a desired movement. On the other hand, the dimensions and mass can be optimized (or adjusted) to obtain a flatter frequency response for a desired frequency bandwidth.

As shown, the cap layer, actuator layer, and CMOS layer are bonded to each other using a bonding process.

FIG. 2 is a simplified illustration that shows movement of the diaphragm with electrostatic actuation according to an example of the present invention. The dashed lines, dotted lines, and solid lines of the actuator layer represent different spatial level of displacement from the original position after an electrostatic actuation is applied from the electrode layers. The vertical up and down movement of the diaphragm is proportional to the audio signal applied to the MEMS speaker cell. The up and down motion pushes air through the perforated MEMS cap thereby creating sound waves.

As also shown, FIG. 2 illustrates how the moving diaphragm is connected to the frame of the micro-speaker device and examples of the springs used in different spatial orientations. The diaphragm can be made of a suitable material such as silicon, graphene or metal or a combination of different materials. Vertical motion of the diaphragm pushes air up through the perforated MEMS cap. The motion of the diaphragm and the air pressure transmits sound waves to the outer environment that is proportional to the audio input, thereby acting as a speaker device.

In an example, baffles are added to prevent back air pressure from mixing with the front air waves. The baffles also protect the MEMS layer and the silicon from external particles entering into the an inner region of speaker device.

In an example, the device can include one or more holes in the diaphragm to mitigate a squeezed film damping and increase the resonant frequency and bandwidth of the speaker. The holes can also help in certain process steps in the fabrication of the speaker.

FIG. 3 is a simplified diagram showing an example of a top view of a diaphragm with springs and cantilevers according to the present invention. As shown is a square shaped diaphragm, although there can be other shapes. Each of the sides is connected to a spring or cantilever device each of which is secured to an outer frame structure. The dimensions and arrangement as shown in FIG. 3 are only for illustration as there can be several other optimized configurations of the cantilevers, springs and diaphragm shapes and sizes that are possible.

FIG. 4 shows an example where additional electrodes are configured on the CMOS layer as well as the cap layer. The electrodes marked as 'sense electrodes' are used to track the capacitive change created by the displacement in the position of the diaphragm and MEMS proof mass. On an Application Specific Integrated Circuit (ASIC), the change in capacitance can be tracked to sense the precise position of the MEMS proof mass and the diaphragm. The electrical signal created, which can be proportional to the MEMS proof mass displacement, can be used for controlling damping or non-linearity compensation.

FIG. 5 shows a perspective view of an example showing the encapsulation or the cap layer. The cap layer will have one or more vents to allows sound pressure to be coupled to the medium outside the encapsulation thereby allowing the sound waves to pass. The encapsulation layer also acts as barrier for dust and other ailments. In an example of the invention, the cap layer or addition encapsulation adds material with barrier to humidity, water and dust particles but allows sound waves to pass through.

FIG. 6 is a simplified diagram that shows a speaker array where multiple such speakers cells are placed next to each other. For example, a speaker cell C1 in FIG. 6 can have a resonance frequency at frequency F1, cell C2 at frequency F2 and so on. The resultant frequency response of the combined system can be optimized (or adjusted) to achieve an overall wide band frequency response or have a boost in the band of interest.

FIG. 7 is a simplified diagram that shows how multiple speaker cells can also be optimized (or adjusted) to create an audio 'equalizer'. Each cell or multiple cells can be optimized to cover bass, mid-band, and Treble frequency responses. A user can then adjust the equalizer to a desired setting, including one of a plurality of parameters.

FIG. 8 is an illustration that shows CMOS ASIC that is monolithically integrated with the micro speaker in an example. The ASIC will have audio pre-processing. The pre-processing will optimize (or process) the signal fed to the electrodes thereby achieving a desired frequency response from the micro-speaker device. The pre-processing may also include wireless connectivity such as Bluetooth™ or others.

A method for fabricating the device begins with conventional silicon and MEMS process technology. As an example, the fabrication process for the present invention can use Silicon on Insulator (SOI) to create the diaphragm layer. The SOI wafer can be thinned down to desired thickness of the diaphragm. Germanium is sputtered and etched to define surface for fusion bonding with a separate CMOS wafer. Then actuator etching is achieved with Deep Reactive Ion Etch (DRIE) to define the MEMS element including actuation area, the beam area, and the springs. The processed SOI wafer is then fusion bonded with the CMOS wafer. The CMOS wafer will have fabricated ASIC function and also the top metal surfaces in the desired actuation area to serve as actuation electrodes. The etch of the diaphragm is then relieved to make its motion possible. Additional bottom etch at the bottom of CMOS may be made to create a vent hole. Of course, one of ordinary skill in the art would recognize other variations, modifications, and alternatives. Further details of the present method can be found throughout the present specification and more particularly below.

FIG. 9A is a simplified diagram illustrating a process starting point with (i) Bottom—unprocessed CMOS wafer (ii) Middle—SOI wafer with thin silicon on top of insulator (Silicon dioxide) and bottom Silicon substrate (iii) top—unprocessed Cap wafer. In an example, each of the wafers can be made using a silicon material, although there can be others.

Figure 9B:
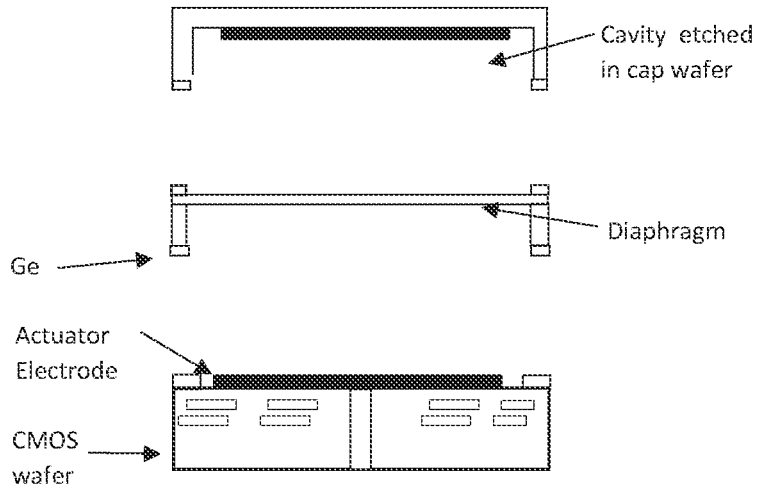

FIG. 9B is a simplified diagram illustrating processed wafers (i) Bottom—processed CMOS wafer with actuation electrodes (ii) Middle—SOI wafer where a first silicon layer defines the diaphragm and the second silicon layer forms the posts where metal such as Aluminum or Germanium can be deposited for bonding this layer with the CMOS layer and with the cap layer (iii) top—processed Cap wafer where a cavity is etched and as an example, metal is deposited to act as top electrode layer. As shown, the bottom wafer includes CMOS cells, and a plurality of electrode devices. In an example, the bottom wafer includes edge posts, among other features. As shown in the middle SOI wafer, the device includes germanium deposited for bonding with the bottom CMOS wafer, and also includes germanium material for coupling to the cap wafer. The cap wafer includes a recessed region to form a cavity. Of course, there can be other variations, modifications, and alternatives.

Figure 9C:
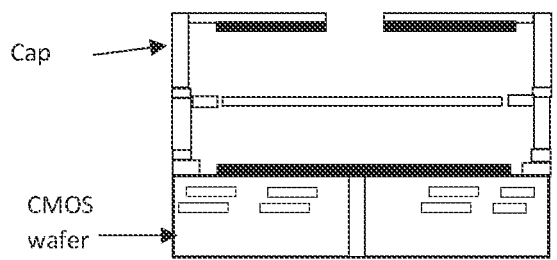

FIG. 9c is a simplified diagram illustrating a processed micro speaker (i) Bottom—processed CMOS wafer with actuation electrodes bonded with Middle—SOI wafer, etch for diaphragm layer to release it, bonded with Cap wafer where vent hole(s) are etched. As shown, the multiple substrates (e.g., bottom, middle, and top) are configured with each other in a multi-layered bonded structure in an example. Of course, there can be other variations, modifications, and alternatives.

In an example, the present invention provides a micro-speaker device. The device has a cap device comprising a plurality of vent regions for propagating acoustic signals. The cap device can be made of a suitable material such as silicon, or other rigid substrate capable of being processed. In an example, the device has a CMOS device coupled to the cap device. In an example, the CMOS device comprises at least one vent region configured to allow backpressure to flow therethrough. The CMOS device can be a CMOS semiconductor substrate, including a plurality of CMOS cells. The device has a cavity region configured between a cap interior surface of the cap device and a CMOS device interior surface of the CMOS device. The device has a frame device coupled between the cap device and the CMOS device to form an exterior housing for the cavity region. An example, the frame device can be configured on either or both of the cap device and/or the CMOS device.

In an example, the device has a movable diaphragm device comprising a thickness of silicon or graphene material having a thickness 0.1 nm to ten microns, and configured spatially in an elongated manner within the cavity region. In an example, the movable diaphragm device has a first surface and a second surface opposite of the first surface. In an example, the movable diaphragm is connected with at least two cantilever or springs. Each of the cantilever or springs being coupled between a peripheral region of the movable diagram device and a portion of a frame configured surrounding the movable diaphragm device.

In an example, the device has a CMOS electrode device configured on the CMOS device interior region. That is, the CMOS device has an electrode device or devices formed on an interior region of the CMOS device.

In an example, the device has a cap electrode device configured on the cap interior surface, whereupon each of the cap electrode device and the CMOS electrode device is operable to electrostatically move the movable diaphragm using a pull action to cause movement of the diaphragm in response to the applied electrical signals and to cause movement of the diaphragm in response to the applied electrical signals and cause propagation of acoustic signals from one or more of the plurality of vent regions in the cap device.

In an example, the electrodes produce an electrostatic force to move the movable diaphragm device from a first spatial region to a second spatial region within the cavity and configured in an out of plane shape concurrent with the movement.

In an example, the movable diaphragm device includes one or more peripheral regions that are free standing. In an example, the cavity region comprises a first region facing the first surface and a second region facing the second surface. In an example, the cap device comprises the plurality of vent regions configured to block particles from entering the cavity region but allow passing of sound pressure. In an example, the cap device comprises an insulating material and an overlying metal material to electrically isolate an actuation voltage from the cap device. In an example, the movable diaphragm device is connected to the frame device on each side of the movable diaphragm device.

In an example, the device is characterized by a frequency response associated with a mass of the movable diaphragm device and a spring constant of the spring to achieve resonance at a desired frequency.

In an example, the device further comprises a voltage potential configured between the cap electrode device and the movable diaphragm device to apply an electrostatic force on the movable diaphragm device. In an example, the device has one or more baffles within the cavity region to prevent one or more acoustic waves from propagating from the first surface to the second surface of the movable diaphragm device.

In an example, the device has at least one sense electrode configured on the cap device to track a position of the movable diaphragm device. In an example, the device has at least one sense electrode to detect a position of the movable diaphragm device to provide feedback to control non-ideal behavior of the movable diaphragm device. In an example, the device has at least one sense electrode to provide feedback to apply electrostatic damping on the movable diaphragm device.

In an example, each of the springs comprises one or more cuts in the diaphragm, as illustrated in FIG. 3.

In an example, the present invention provides an alternative speaker device. The device has a CMOS substrate comprising a first surface region and a second surface region. The first surface region is opposite of the second surface region. In an example, the first surface region can be either the front side or backside surface and the second surface can be the backside or frontside surface.

In an example, the device has an N by M array, where N is an integer 1 and greater, and M is an integer 1 and greater, of micro speaker cells configured on the CMOS substrate. Each of the cells can be the same, different, or configured with the same or different sized cells to generate a desirable audio signal or signals. Each of micro speaker cells comprises a cap device comprising a plurality of vent regions for propagating acoustic signals, a cavity region configured between a cap interior surface of the cap device and a CMOS device interior surface of the CMOS device, and a frame device coupled between the cap device and the CMOS device to form an exterior housing for the cavity region.

Each of the cells has a movable diaphragm device comprising a thickness of silicon or graphene material having a thickness 0.1 nm to ten microns, and configured spatially in an elongated manner within the cavity region. The movable diaphragm device has a first surface and a second surface opposite of the first surface. The movable diaphragm is connected with at least two cantilever or springs. Each of the cantilever or springs is coupled between a peripheral region of the movable diagram device and a portion of a frame configured surrounding the movable diaphragm device.

Each cell has a CMOS electrode device configured on the CMOS device interior region. Additionally, each cell has a cap electrode device configured on the cap interior surface, whereupon each of the cap electrode device and the CMOS electrode device is operable to electrostatically move the movable diaphragm using a pull action to cause propagation of acoustic signals from one or more of the plurality of vent regions in the cap device.

In an example, the array of microspeaker cells is configured to create a wider band flat frequency response. In an example, the array of micro-speaker cells is configured to move the movable diaphragm devices in a different phase to produce a desired acoustic signal. In an example, the array of microspeaker cells is configured to create a frequency boost at a desired single or multiple bands of frequencies and is configured to create an audio equalizer including a bass, mid band, and treble frequencies.

In an example the CMOS device comprises a pre-processor for processing an audio signal for output on the array of micro-speaker cells. Additionally, the device comprises a module comprising an adjustment process to be customized for an individual or individual ear for a desired sound experience. In an example, the array of cells is configured on a single CMOS substrate or a single cap region. In an example, device further comprises a single encapsulation region coupled to the one or more micro speaker cells.

While the above is a full description of the specific examples, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:
1. A micro-speaker device comprising:
a cap device comprising at least one vent region for propagating acoustic signals;
a CMOS device coupled to the cap device, the CMOS device comprising at least one vent region configured to allow backpressure to flow therethrough;
a cavity region configured between a cap interior surface of the cap device and a CMOS device interior surface of the CMOS device;
a frame device coupled between the cap device and the CMOS device to form an exterior housing for the cavity region;
a movable diaphragm device comprising silicon or graphene material having a thickness 0.1 nm to ten microns, and configured spatially in an elongated manner within the cavity region, the movable diaphragm device having a first surface and a second surface opposite of the first surface;
the movable diaphragm device connected with at least two cantilevers or springs, each of the at least two cantilevers or springs being coupled between a peripheral region of the movable diagram device and a portion of the frame device configured surrounding the movable diaphragm device, wherein each of the springs comprises one or more cuts in the movable diaphragm device;
a CMOS electrode device configured on the CMOS device interior surface;
a cap electrode device configured on the cap interior surface, whereupon each of the cap electrode device and the CMOS electrode device is operable to electrostatically move the movable diaphragm device using a pull action to cause movement of the movable diaphragm device in response to applied electrical signals and cause propagation of the acoustic signal from the at least one vent region in the cap device.

2. The micro-speaker device of claim 1, wherein the CMOS electrode device and the cap electrode device provide an electrostatic force to move the movable diaphragm device from a first spatial region to a second spatial region within the cavity and configured in an out of plane shape concurrent with the movement.

3. The micro-speaker device of claim 1, wherein the movable diaphragm device includes one or more peripheral regions that are free standing.

4. The micro-speaker device of claim 1, wherein the cavity region comprises a first region facing the first surface and a second region facing the second surface.

5. The micro-speaker device of claim 1, wherein a frequency response of the micro-speaker device is adjusted by changing dimensions of the at least two springs, or mass of the movable diaphragm device to achieve acoustic resonance at a desired frequency.

6. The micro-speaker device of claim 1, further comprising a voltage potential configured between the cap electrode device and the movable diaphragm device to apply an electrostatic force on the movable diaphragm device.

7. The micro-speaker device of claim 1, further comprising one or more baffles within the cavity region to prevent one or more acoustic waves from propagating from the first surface to the second surface of the movable diaphragm device.

8. The micro-speaker device of claim 1, further comprising at least one sense electrode configured on the cap device to track a position of the movable diaphragm device.

9. The micro-speaker device of claim 1, further comprising at least one sense electrode to detect a position of the movable diaphragm device to provide feedback to control non-ideal behavior of the movable diaphragm device.

10. The micro-speaker device of claim 1, further comprising at least one sense electrode to provide feedback to apply electrostatic damping on the movable diaphragm device.

11. The micro-speaker device of claim 1, wherein the cap device comprises the at least one vent region configured to block particles from entering the cavity region and pass acoustic signals.

12. The micro-speaker device of claim 1, wherein the cap device comprises an insulating material and an overlying metal material to electrically isolate an actuation voltage from the cap device.

13. The micro-speaker device of claim 1, wherein the movable diaphragm device is connected to the frame device on each side of the movable diaphragm device.

14. The micro-speaker device of claim 1, wherein the movable diaphragm device, the at least two cantilevers or springs and at least a portion of the frame device are formed from a common silicon layer.

15. A speaker device comprising:
a CMOS device comprising a first surface region and a second surface region, the first surface region being opposite of the second surface region;
an N by M array, where N is an integer 1 and greater, and M is an integer 1 and greater, of micro speaker cells configured on the CMOS device, each of micro speaker cells comprising:
a cap device comprising a plurality of vent regions for propagating acoustic signals;
a cavity region configured between a cap interior surface of the cap device and a CMOS device interior surface of the CMOS device;
a frame device coupled between the cap device and the CMOS device to form an exterior housing for the cavity region;
a movable diaphragm device formed from a silicon material having a thickness 0.1 nm to ten microns, and configured spatially in an elongated manner within the cavity region, the movable diaphragm device having a first surface and a second surface opposite of the first surface; the movable diaphragm connected with at least two cantilever or springs, each of the at least two cantilever or springs being coupled between a peripheral region of the movable diagram device and a portion of the frame device configured surrounding the movable diaphragm device, wherein each of the at least two cantilevers or springs comprises one or more cuts in the silicon material;
a CMOS electrode device configured on the CMOS device interior region;
a cap electrode device configured on the cap interior surface, whereupon each of the cap electrode device and the CMOS electrode device is operable to electrostatically move the movable diaphragm device using a pull action to cause propagation of acoustic signals from one or more of the plurality of vent regions in the cap device.

16. The speaker device of claim 15, wherein the array of microspeaker cells is configured to create a wider band frequency response and desired sound pressure intensity.

17. The speaker device of claim 15, wherein the array of micro-speaker cells is configured to move the movable diaphragm devices in a different phase to produce a desired acoustic signal.

18. The speaker device of claim 15, wherein the array of microspeaker cells is configured to create a frequency boost at a desired single or multiple bands of frequencies; and configured to create an audio equalizer including a bass, mid band, and treble frequencies.

19. The speaker device of claim 15, wherein the CMOS device comprises a pre-processor for processing an audio signal for output on the array of micro-speaker cells.

20. The speaker device of claim 15, further comprising a module coupled to the device to adjust one or more features of one or more micro speaker cells to produce a desired sound experience.

21. The speaker device of claim 15, wherein the CMOS device is a single substrate coupled to the array of micro speaker cells.

22. The speaker device of claim 15, further comprising a single encapsulation region coupled to the array of micro speaker cells.

* * * * *